United States Patent
Van Der Pasch et al.

(10) Patent No.: US 9,470,988 B2
(45) Date of Patent: Oct. 18, 2016

(54) SUBSTRATE POSITIONING SYSTEM, LITHOGRAPHIC APPARATUS AND DEVICE MANUFACTURING METHOD

(71) Applicant: ASML Netherlands B.V., Veldhoven (NL)

(72) Inventors: Engelbertus Antonius Fransiscus Van Der Pasch, Oirschot (NL); Albert Johannes Maria Jansen, Eindhoven (NL); Andre Bernardus Jeunink, Bergeyk (NL); Johannes Mathias Theodorus Antonius Adriaens, Eindhoven (NL); Frank Auer, Valkenswaard (NL); Peterjan Broomans, Eindhoven (NL); Suzanne Johanna Antonetta Geertruda Cosijns, Casteren (NL); Willem Herman Gertruda Anna Koenen, Roermond (NL); Sebastiaan Smit, Utrecht (NL); Joris Wilhelmus Henricus Vermunt, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/437,441

(22) PCT Filed: Oct. 17, 2013

(86) PCT No.: PCT/EP2013/071780
§ 371 (c)(1),
(2) Date: Apr. 21, 2015

(87) PCT Pub. No.: WO2014/063995
PCT Pub. Date: May 1, 2014

(65) Prior Publication Data
US 2015/0277242 A1 Oct. 1, 2015

Related U.S. Application Data

(60) Provisional application No. 61/718,094, filed on Oct. 24, 2012.

(51) Int. Cl.
*G03F 7/20* (2006.01)

(52) U.S. Cl.
CPC ....... *G03F 7/70775* (2013.01); *G03F 7/70516* (2013.01); *G03F 7/70716* (2013.01)

(58) Field of Classification Search
CPC .......... G03F 7/70516; G03F 7/70716; G03F 7/70775; G03F 2009/005; G03F 9/7003; G03F 9/7007; G03F 9/7019; G03F 9/7049; G03F 9/7053
See application file for complete search history.

(56) References Cited

U.S. PATENT DOCUMENTS

| | | |
|---|---|---|
| 7,161,659 B2 | 1/2007 | Van Den Brink et al. |
| 7,483,120 B2 | 1/2009 | Luttikhuis et al. |

(Continued)

FOREIGN PATENT DOCUMENTS

| | | |
|---|---|---|
| CN | 101071276 A | 11/2007 |
| CN | 102096339 A | 6/2011 |
| EP | 1 710 629 | 10/2006 |
| JP | 7-190741 | 7/1995 |

(Continued)

OTHER PUBLICATIONS

International Search Report mailed Apr. 10, 2014 in corresponding International Patent Application No. PCT/EP2013/071780.

(Continued)

*Primary Examiner* — Michelle M Iacoletti
(74) *Attorney, Agent, or Firm* — Pillsbury Winthrop Shaw Pittman LLP

(57) ABSTRACT

A positioning system for positioning an object in a lithographic apparatus, including: a first and second object tables moveable in an operating area; a first position measurement system to provide an incremental position measurement of the second object table relative to a reference when in the operating area, wherein the first position measurement system is configured to provide an absolute position measurement of the first object table relative to the reference; a second position measurement system to provide an absolute position measurement of the first object table relative to the second object table, and wherein the first position measurement system is further configured to provide an absolute position measurement of the second object table relative to the reference based on the absolute position measurement of the first object table relative to the reference and on the absolute position measurement of the first object table relative to the second object table.

15 Claims, 12 Drawing Sheets

(56) References Cited

U.S. PATENT DOCUMENTS

| | | |
|---|---|---|
| 7,655,367 B2 | 2/2010 | Buurman et al. |
| 7,884,918 B2 | 2/2011 | Hattori |
| 8,451,454 B2 | 5/2013 | Koenen et al. |
| 2002/0082801 A1 | 6/2002 | Shiraishi |
| 2005/0255624 A1 | 11/2005 | Miyajima |
| 2006/0227308 A1 | 10/2006 | Van Den Brink et al. |
| 2007/0263197 A1 | 11/2007 | Luttikhuis et al. |
| 2008/0304050 A1 | 12/2008 | Kurosawa |
| 2008/0316446 A1 | 12/2008 | Shibazaki |
| 2010/0044943 A1 | 2/2010 | Vermeulen et al. |
| 2011/0051109 A1 | 3/2011 | Emoto et al. |

FOREIGN PATENT DOCUMENTS

| | | |
|---|---|---|
| JP | 2002-195819 | 7/2002 |
| JP | 2008-535209 | 8/2008 |
| JP | 2008-306099 | 12/2008 |
| JP | 2009-135490 | 6/2009 |
| JP | 2009-295932 | 12/2009 |
| JP | 2011-54694 | 3/2011 |

OTHER PUBLICATIONS

Chinese Office Action mailed Mar. 25, 2016 in corresponding Chinese Patent Application No. 201380055536.7.
Japanese Office Action mailed Mar. 23, 2016 in corresponding Japanese Patent Application No. 2015-538386.

SUBSTRATE POSITIONING SYSTEM, LITHOGRAPHIC APPARATUS AND DEVICE MANUFACTURING METHOD

CROSS-REFERENCE TO RELATED APPLICATIONS

This application is the U.S. National Stage of PCT/EP2013/071780, filed Oct. 17, 2013, which in turn claims the benefit of U.S. provisional application 61/718,094, which was filed on Oct. 24, 2012, the contents of all of these applications being incorporated herein in its their entirety by reference.

FIELD

The present invention relates to a substrate positioning system, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure the proper operation of the IC, an accurate positioning of the substrate during the exposure process is desired. As such, a lithographic apparatus is typically equipped with one or more position measurement systems to determine a position of an object table (to which the substrate is mounted) relative to the patterning device. As an example, a lithographic apparatus can be provided with an incremental position measurement system, e.g. an encoder based measurement system or an interferometer measurement system, for measuring the position of an object table relative to a projection system of the apparatus. A further, similar measurement system can be provided to determine a position of the patterning device relative to the projection system. Typically, an incremental position measurement system provides in a periodic measurement signal (e.g. having a period corresponding to a period of a grating of the measurement system) that needs to be referenced or zeroed in order to obtain an absolute position measurement. Such referencing or zeroing may require the object table to move to a particular designated reference position and/or may require adjustments to the measurement system. In case the referencing requires a particular positioning of the object table, this may result in a throughput penalty for the apparatus.

SUMMARY

It is desirable to provide in a positioning system having an alternative way of referencing or zeroing. Therefore, in an embodiment of the present invention, there is provided a positioning system for positioning a substrate in a lithographic apparatus. The positioning system comprises a first object table moveable in an operating area; a second object table moveable in the operating area; a first position measurement system configured to provide an incremental position measurement of the first object table and the second object table relative to a reference when in the operating area, wherein the first position measurement is configured to provide an absolute position measurement of the first object table relative to the reference; a second position measurement system configured to provide an absolute position measurement of the first object table relative to the second object table. The first position measurement system is further configured to provide an absolute position measurement of the second object table relative to the reference based on the absolute position measurement of the first object table relative to the reference and on the absolute position measurement of the first object relative to the second object.

In another embodiment, there is provided a method of determining an absolute position of a second object table relative to a reference in a dual stage lithographic apparatus comprising a first and second object table, the method comprising: providing an incremental position measurement of the first object table and the second object table relative to the reference; obtaining an absolute position measurement of the first object table relative to the reference; obtaining an incremental position measurement of the second object table relative to the reference; obtaining an absolute position measurement of the first object table relative to the second object table; determining the absolute position of the second object table relative to the reference based on the absolute position measurement of the first object table relative to the reference and on the an absolute position measurement of the first object table relative to the second object table.

In yet another embodiment, there is provided a positioning system for positioning an object in a lithographic apparatus, the system comprising: a first and a second object table moveable in an operating area; a first position measurement system configured to provide (a) an incremental position measurement of the first object table and the second object table relative to a reference when the first object and the second object table are located in the operating area, and (b) an absolute position measurement of the first object table relative to the reference, and a second position measurement system configured to provide an absolute position measurement of the first object table relative to the second object table, and wherein the first position measurement system is further configured to provide an absolute position measurement of the second object table relative to the reference based on the absolute position measurement of the first object table relative to the reference and on the absolute position measurement of the first object relative to the second object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
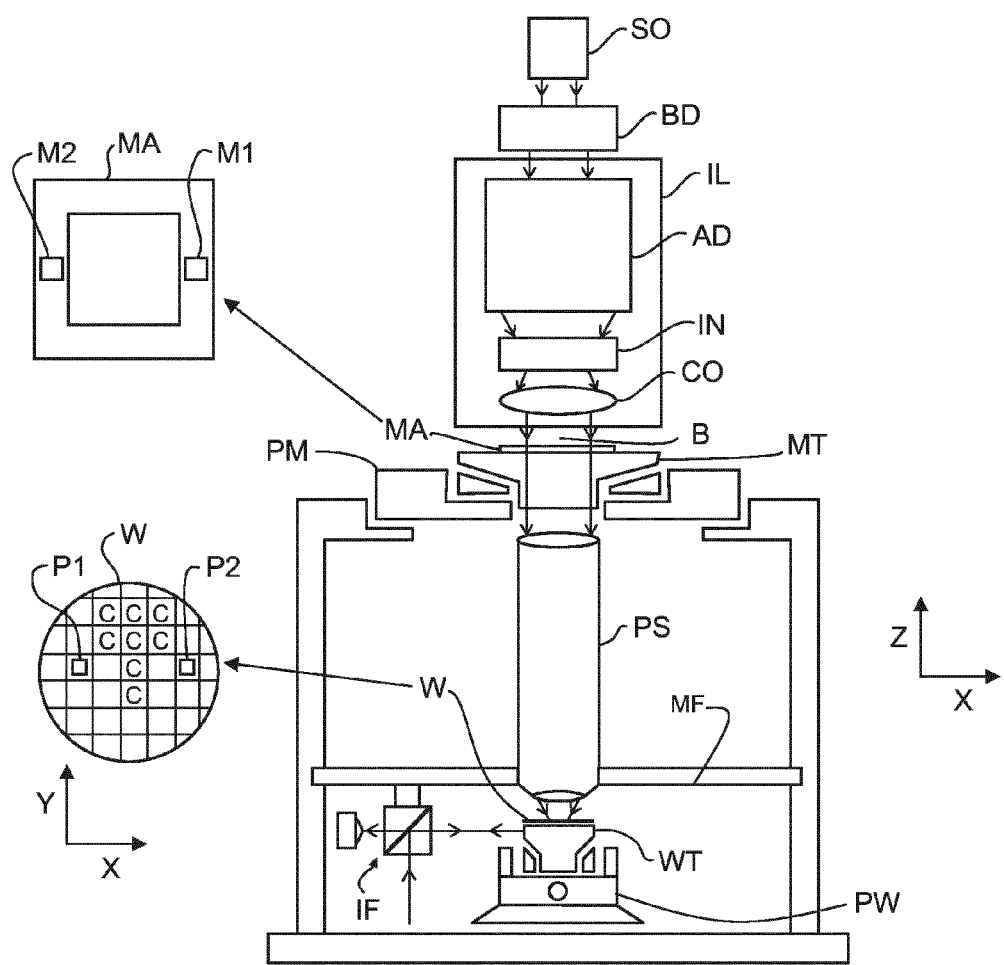
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure or patterning device support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, no as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and positioning system IF (e.g. an interferometric device, linear encoder or capacitive sensor), the substrate table WT can be moved accurately, e.g. so as to position different target portions C in the path of the radiation beam B. The positioning system IF can e.g. be mounted to a metrology frame MF, to which the projection system PS may also be mounted. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

In accordance with an embodiment of the present invention, the lithographic apparatus can be equipped with an incremental position measurement system (such as the indicated system IF) for accurately positioning the substrate table WT relative to the projection system PS, in general, relative to a reference. Typically, when an incremental position measurement system is used, a zeroing or referencing system is present in order to convert a measurement signal obtained from the incremental position measurement system to an absolute position signal. In an embodiment of the present invention, zeroing or referencing is used to indicate the determining in which period the incremental position measurement system is measuring. Such zeroing or referencing system thus provides in a labeling of a certain period of the incremental measurement system as an absolute reference. In an embodiment of the present invention, a way of referencing or zeroing is proposed that is particularly suited for multistage apparatuses, i.e. apparatuses having two or more object tables. As an example of such an apparatus, a dual stage apparatus can be considered. In such an apparatus, two object tables can be provided, each may be configured to support a substrate. Such a dual stage arrangement enables the parallel processing of two substrate whereby a first substrate (on a first object table) is exposed (i.e. provided with a desired pattern) while a second substrate (on a second object table) is measured (e.g. a height map of the substrate is obtained). Alternatively, one of the object tables may be a measurement table. The measurement table may be provided with equipment to perform measurements, such as optical properties of a light beam passing through the projection system or other parameters of the apparatus. In an embodiment of a dual stage arrangement, one object table holds a substrate and the other object table performs measurements.

In such arrangement, after completion of the exposure of the first substrate and the measuring of the second substrate, the second object table needs to be brought underneath the projection system, in order to expose the second substrate.

When the second object table (provided with the substrate to be exposed) approaches the operating area where the exposure needs to take place, the object table comes within the operating range of the incremental position measurement system. In general, the position of this second object table may not be know in an absolute sense; i.e. a referencing or zeroing may be required in order to establish an absolute position of the second object table, relative to the projection system PS or another reference (e.g. the metrology system MF). In accordance with an embodiment of the present invention, the referencing or zeroing of the second object table is derived from the position of the first object table (which is assumed to be known in absolute sense, relative to the reference) and an absolute position measurement of the distance between the first object table and the second object table. Using this approach, the referencing or zeroing does not require the positioning of the object table to a dedicated reference location. As will be explained in more detail below, the referencing or zeroing can e.g. take place during a swap of the object tables, i.e. when the first object table is moved away from being underneath the projection system while the second object table is moved to a position underneath the projection. Alternatively, the referencing or zeroing can take place before or after such a swap.

In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
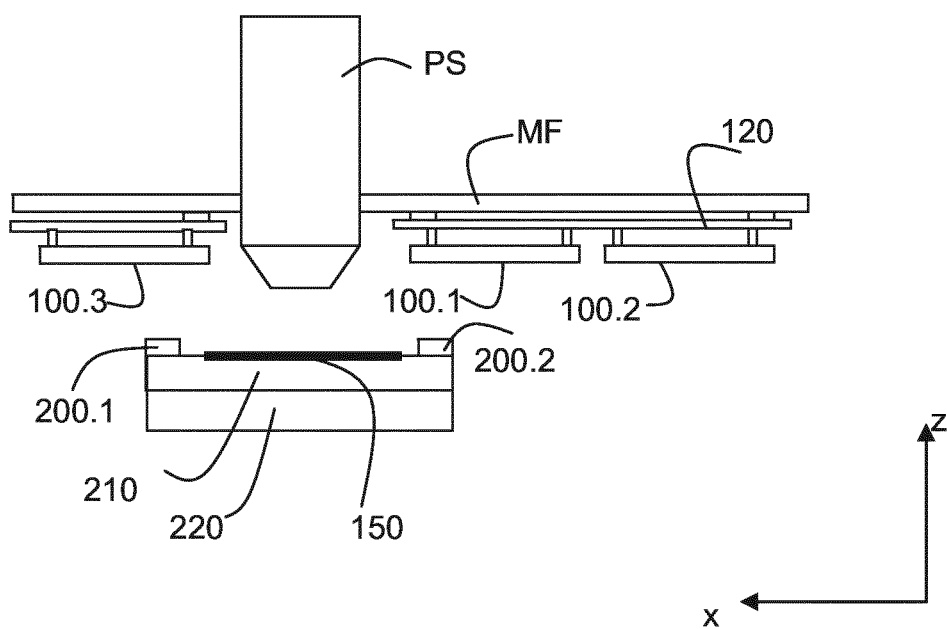
FIG. 2 depicts an incremental position measurement system as can be applied in a positioning system according to an embodiment of the invention.

In FIG. 2, an embodiment of an incremental position measurement system is schematically shown, the measurement system comprising a plurality of position sensors 200.1, 200.2 co-operating with gratings 100.1, 100.2, 100.3 (acting as a position sensor target), which can e.g. be one- or two-dimensional gratings. In the arrangement as shown, the gratings 100.1 and 100.2 are mounted to a common frame 120 of the measurement system (the frame e.g. being made from Zerodur or any other type of low thermal expansion material) which can e.g. be mounted to a reference frame such as a metrology frame MF to which a projection system PS (see also FIG. 1) is also mounted. Note that, as an alternative to having multiple gratings, a single, comparatively large grating or sensor target can be applied as well. In the embodiment shown, the position sensors 200.1 and 200.2 are mounted to an object table 210 which can e.g. be a substrate table that is mounted to a positioning device 220 for displacing the object table 210 relative to the projection system PS, e.g. by means of linear motors or actuators. An incremental position measurement system as depicted can provide in a measurement signal that typically is a combination of a counter value and a phase value. The phase value of the measurement signal represent a position within a certain period of the grating or sensor target, whereas the counter represents the period that is observed by the sensor. In order for the measurement signal to represent an absolute value of a distance between e.g. the object table 210 and the projection system PS, the counter value needs to be set or initiated. This can e.g. be done by providing a reference mark on the grating or sensor target. Alternatively, an initial value of the counter can be obtained by using a referencing or zeroing system. Such a referencing or zeroing system can e.g. comprises an absolute position measurement system that is positioned at a fixed, know location. As such, when the object table 210 is positioned within the operating range of the referencing or zeroing system, the incremental position measurement system can be initiated such that the position signals provided by the system represent an absolute position of the sensor relative to the sensor target (or of the object table relative to the position reference (e.g. the projection system); i.e. the distance (in a given direction) between sensor and the sensor target.

Such a referencing or zeroing system can e.g. be provided near a boundary of an operating area of the object table, wherein the operating area is defined by the area that can be covered by the object table while within range of the incremental position measurement system.

In a dual or multi-stage lithographic apparatus, two or more object tables can be present that transfer substrates to be processed. In such apparatus, different operating areas may be defined whereby different processes can take place in the different operating areas. As an example, a dual stage lithographic apparatus can comprises a first operating area where a substrate is measured (e.g. a height map of the substrate is recorded) and a second operating area where a substrate is exposed. In both operating areas, an accurate position measurement system such as the incremental position measurement system as described above can be available. However, during a transition between the first operating area and the second operating area, the accurate position control may not be maintained. This can e.g. occur when both operating areas are not connected to each other. Further limitations such as the building size of the gratings or sensor targets or a required positioning of the object tables outside the operating range may also give rise to a transfer between operating areas whereby the referencing or zeroing as applied in the first operating area is no longer valid in the second operating area.

As a result, an object table supporting a substrate to be exposed (e.g. a substrate which has been measured earlier), may require referencing or zeroing prior to the exposure process. Phrased differently, the counter value of the sensor of the object table may need to be set or initiated when operating in the operating area where the exposure takes place. How such a referencing can be provided, in accordance with an embodiment of the present invention, is schematically illustrated in FIG. 3.

Figure 3:
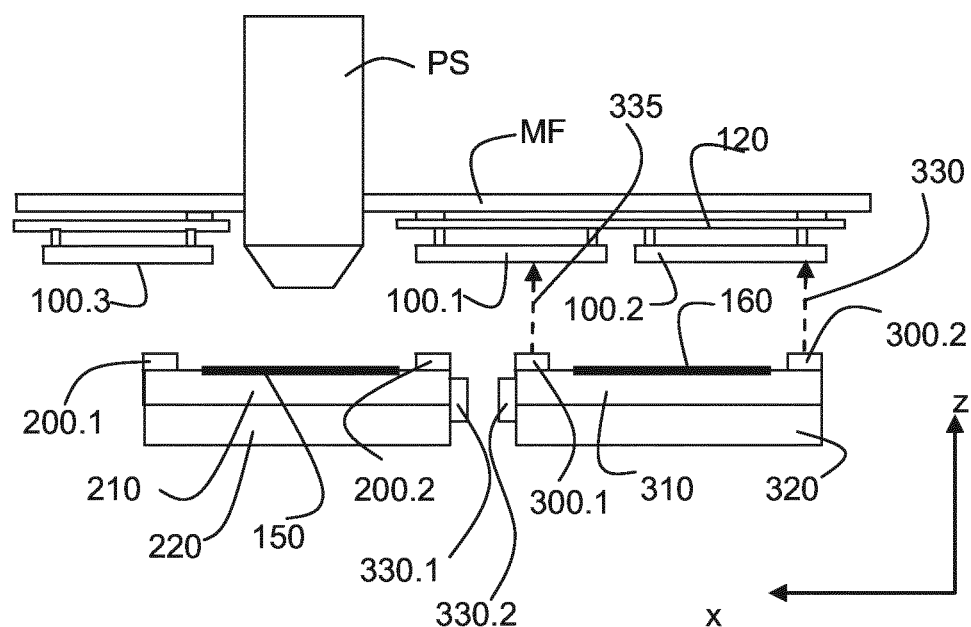
FIG. 3 schematically depicts a positioning system according to an embodiment of the present invention.

FIG. 3 schematically shows an embodiment of a substrate positioning system according to an embodiment of the present invention. In FIG. 3, a first position measurement system (an incremental position measurement system comprising sensor targets or gratings 100.1-100.3, position sensors 200.1 and 200.2 (mounted to a first object table 210) and position sensors 300.1, 300.2 (mounted to a second object table 310). In the arrangement as shown, it is assumed that the substrate 150 on the first object table 210 has been processed; i.e. has been exposed to a patterned radiation beam using the projection system PS. The sensors 200.1 and 200.2 associated with the first object table 210 are thus assumed to be referenced or zeroed. A position signal of these sensors thus provides in an absolute position measurement of the first object table relative to a reference such as the projection system PS or the frame MF. The second object table 310 (which can be positioned by a positioning device 320, similar to the positioning device 220) is, in the arrangement as shown, within an operating range of the sensor targets or gratings 100.1, 100.2, as indicated by the dotted lines 335, 330. As discussed above, in case the second object table enters the operating area, a zeroing or referencing may be required. In accordance with an embodiment of the present invention, such referencing or zeroing of the second object table can be realized without the second object table being positioned near a referencing or zeroing system or without the use of a reference mark on one of the gratings. Rather, in the substrate positioning system according to an embodiment of the invention, a second position measurement system is applied, the second position measurement system being configured to provide in an absolute position measurement of the first object table relative to the second object table. As an example, as illustrated in FIG. 3, the second position measurement system 330.1, 330.2 can comprises a capacitive measurement system having a capacitive sensor 330.1 mounted to the first object table and a capacitive target 330.2 mounted to the second object table. The use of the second position measurement system enables to obtain an accurate, absolute value of the distance between the first and second object table. By providing this distance to the first position measurement system, the referencing or zeroing of the sensors 300.1 and 300.2 of the second object table can be realized; As such, in accordance with an embodiment of the present invention, the first position measurement system can be configured to provide in an absolute position measurement of the second object table relative to the reference based on the absolute position measurement of the first object table relative to the reference (e.g. obtained from the position measurement of the sensors 200.1 and 200.2) and on the absolute position measurement of the first object relative to the second object (i.e. the distance between the first and second object table as measured by the second position measurement system 300.1, 300.2).

Note that the use of a capacitive measurement system as the second position measurement system is merely an example. Other examples are optical measurement systems such as encoder based measurement systems.

Using the system as described above, the processing of the second object table 310 (more particular the processing of the substrate 160 mounted to the second object table) can commence substantially without any delay once the second object table is within an operating range of the second position measurement system 300.1, 300.2.

In an embodiment, the second position measurement system comprises a 6 DOF (degrees of freedom) measurement system. Similarly, the sensors mounted to the first object table 210 (of which sensors 200.1 and 200.2 are shown) or the sensors mounted to the second object table 310 (of which sensors 300.1 and 300.2 are shown) may provide in a 6 DOF measurement of the position of the resp. object tables relative to the reference, e.g. the projection system PS. In order to realise this, each of the object tables 210, 310 can be provided with 4 2D sensors, e.g. positioned near the corners of the object table.

In an embodiment of the present invention, the substrate positioning system is further provided with a referencing system for referencing or zeroing the first position measurement system. Such a referencing system can be provided as back-up, in case, due to a failure, the absolute position measurement of the first object table is no longer valid or can be used for an initialisation of the system.

In FIGS. 4a to f, a plan view is shown of a substrate positioning system according to an embodiment of the present invention in various stages of a processing cycle of a substrate.

Figure 4A:
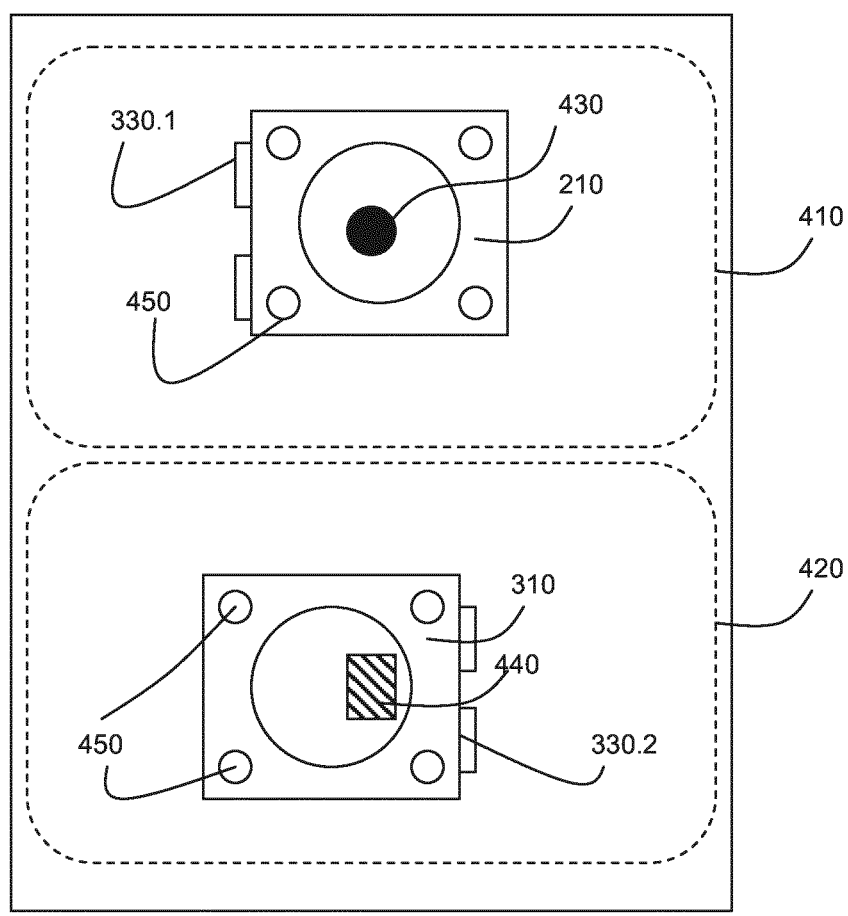
FIGS. 4a-4f schematically show a plan view of a positioning system according to an embodiment of the present invention, implemented in a lithographic apparatus according to an embodiment of the invention.
Figure 4B:
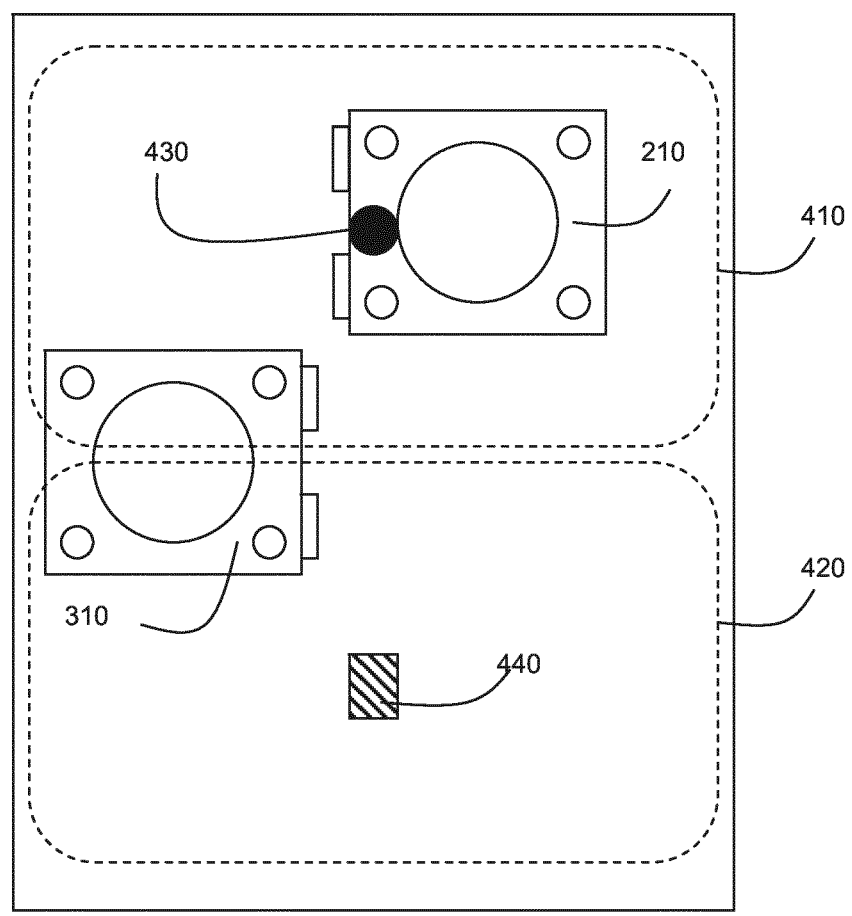
Figure 4C:
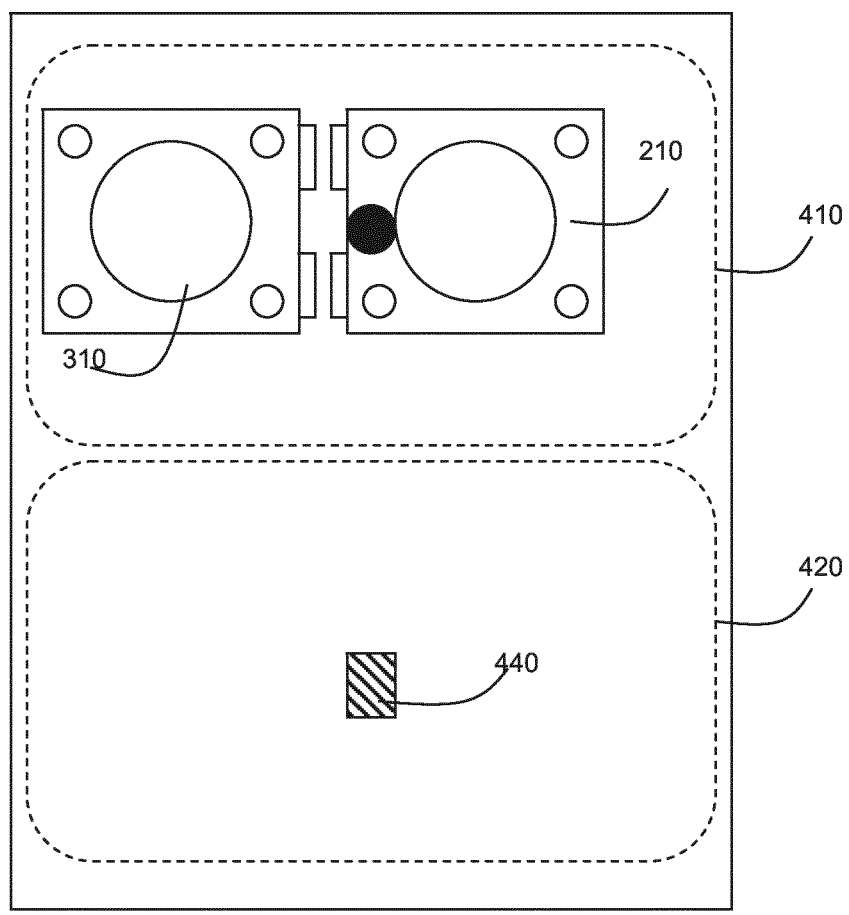
Figure 4D:
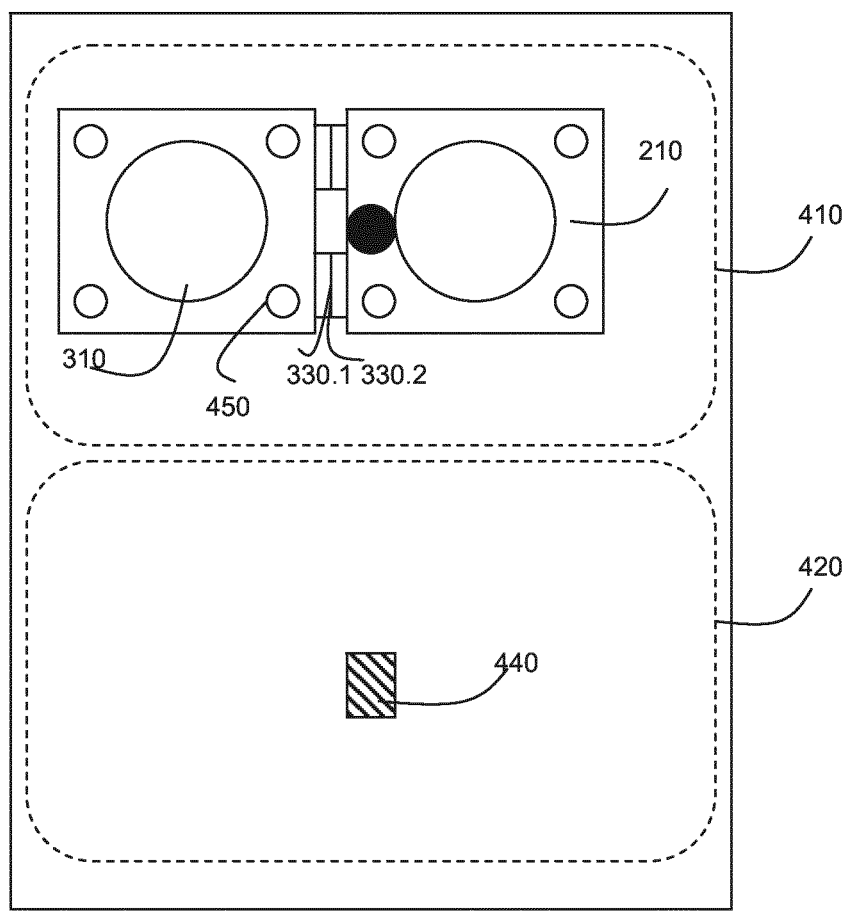
Figure 4E:
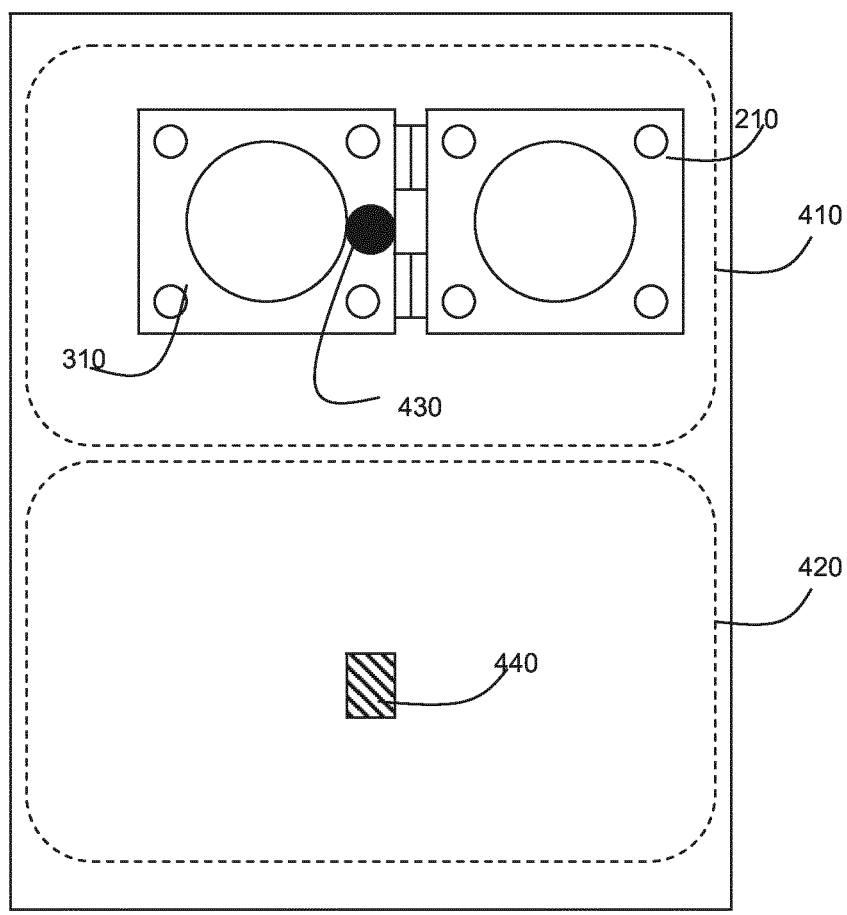
Figure 4F:
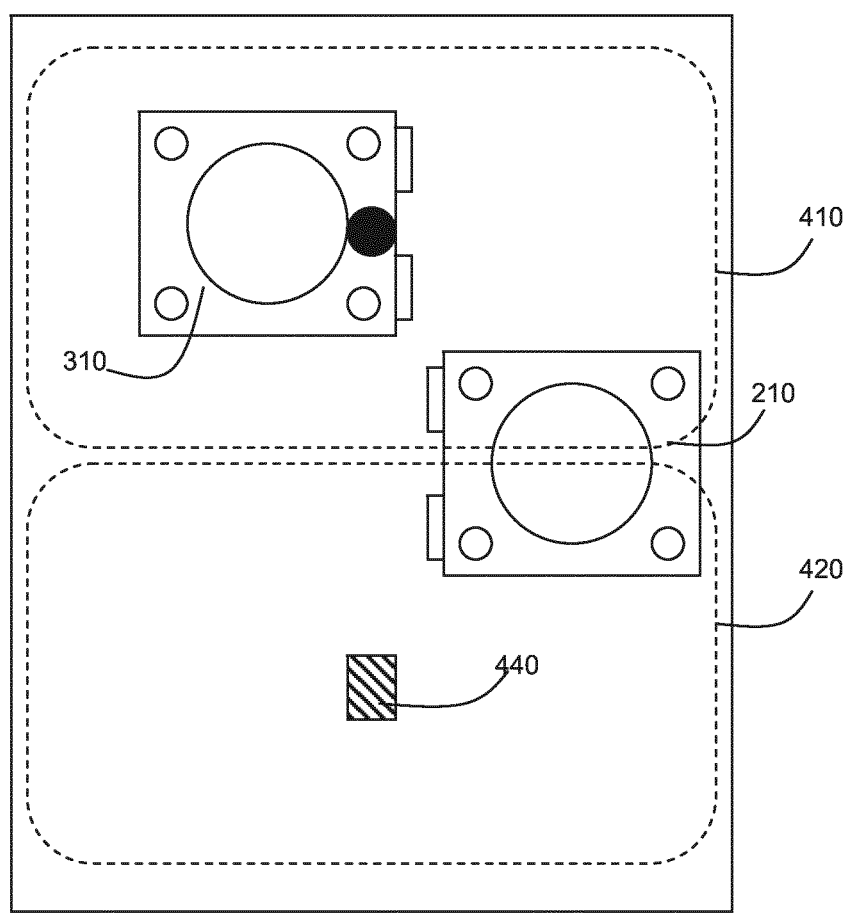

In FIG. 4a, a first and second operating area (410, 420) are shown together with a first object table 210 (operating in the first operating area) and a second object table 310 (operating in the second operating area). In the first operating area, a measuring process can be performed using a level sensor 440, in order to obtain a height map of a substrate (not shown) mounted to the object table 310. In the second operating area, an exposure of a substrate (not shown) mounted on the object table 210 can be performed using a projection system, schematically indicated by the reference number 430. The object tables 210 and 310 are each provided with 4 sensors 450 of a first position measurement system, which can e.g. be 2D encoder based sensors for co-operating with a grating or sensor target (not shown) to determine a position of the object table relative to a reference (e.g. the projection system 430 or the level sensor 440). As further shown, the first and second object table 210 and 310 are provided with a second position measurement system 330.1, 330.2 for providing an absolute position measurement of the first object table relative to the second object table. FIGS. 4b to 4f show a typical operating sequence wherein, when a substrate provided on the second object table 310 is transferred from the measurement operating area 420 to the exposure operating area 410. Note that, as described above, during the transfer between both operating area's, an accurate position control of the object table 310 may not be available; a further position control system may thus be needed to enable the transition of the object table 310 as shown in FIGS. 4b and 4c. When the object tables 310 and 210 are brought sufficiently close together, as shown in FIG. 4d (i.e. co-operating members 330.1 and 330.2 are brought within operating range), the sensors 450 of the first object table can be referenced or zeroed as described above. Note that such referencing or zeroing may also be performed during the next operating step shown in FIG. 4e, whereby a swap of the object tables is performed, thereby replacing the object table 210 from being underneath the projection system 430 by object table 310. Note that in general, such a swap need not be a synchronised movement between both object tables. However, in case of an immersion lithographic apparatus, such a synchronised movement provides the benefit that the immersion liquid which is contained in a space between the object table and the projection system remains contained to the space during a swap of object tables. A gap between the object tables may be minimized, thereby minimizing leakage of liquid from the space. Once the swap has been performed, the object table 210 can be transferred to the measurement area to unload the exposed substrate and receive a next substrate. Once such next substrate is e.g. measured, using the level sensor 440, the cycle as depicted in FIGS. 4b to 4e can be repeated, but in reverse order, i.e. the object tables will move counter clockwise.

Figure 5:
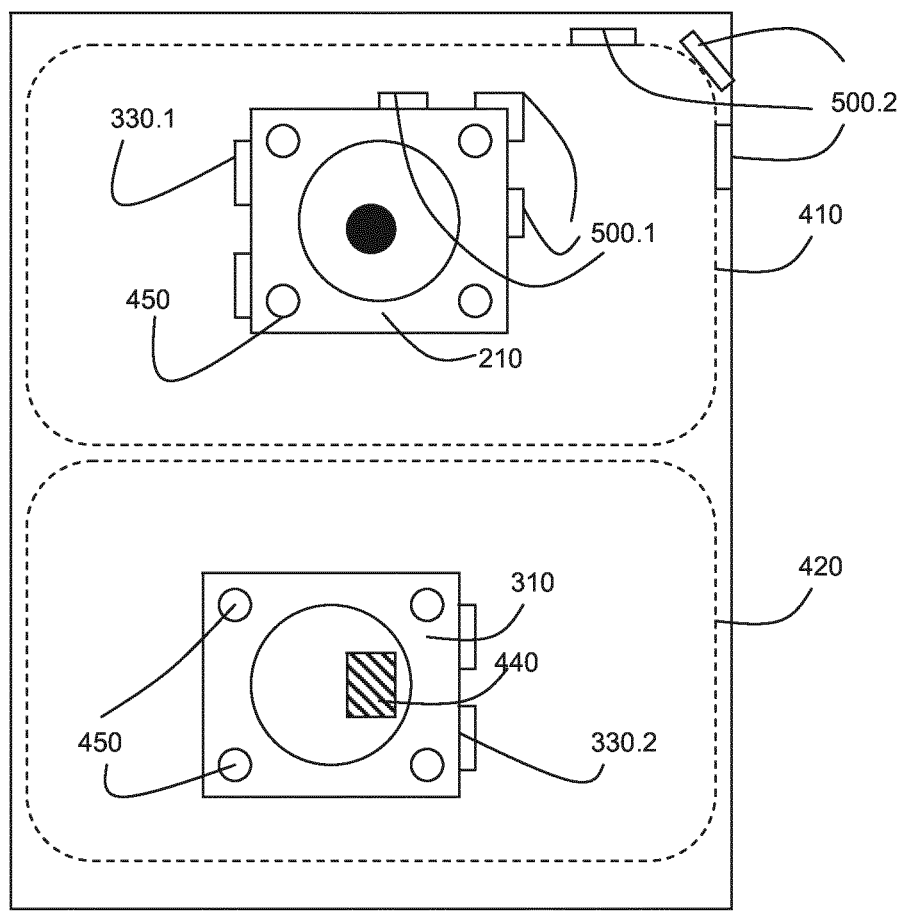
FIG. 5 schematically shows a plan view of a positioning system according to an embodiment of the present invention including a referencing or zeroing system.

For an initialisation or in case of an error or failure resulting in the first object table losing its referencing, a referencing or zeroing system can, in an embodiment of the present invention can be provided. In FIG. 5, such a zeroing system is schematically shown near a border or corner of the operating area 410. In case the operating area 410 is an area in which the first positioning system needs to determine the position of the first object table or second object table with a high accuracy, the zeroing system may be outside the operating area 410. Outside the operating area 410 the position of the first object table or second object table may be determined by the first positioning system with a low accuracy. The referencing system as shown (members 500.1) mounted to the object table 210 and members 500.2 arranged near an edge of the operating area 410. In an embodiment, the referencing or zeroing system can provide an absolute position measurement of the object table to which the members 500.1 are connected, preferable in 6 DOF. As a possible implementation of such a system, the members 500.1 can comprise 3 2 DOF targets such as corner cubes, to which a set of measurement beams (of members 500.2) are directed. A similar zeroing system (members 500.1) can also be applied to the second object table 310 (not shown). Note that the position of the referencing system (500.1, 500.2) need not be as indicated in FIG. 5. Rather, any position enabling a referencing of the first position measurement system can be suitable applied. Further, in an embodiment, a further referencing system, e.g. similar to the system 500.1, 500.2, can be applied in the second operating area 420, for referencing or zeroing the first position measurement system of the second operating area.

In an embodiment the zeroing system is part of the first position measurement system. In this embodiment, the first position measurement system is able to provide an incremental position measurement of the first object table and the second object table relative to a reference when the first object table or the second object table is in the operating area 410. The first positioning measurement system is also able to provide an absolute position of the first object table relative to the reference by using the zeroing system.

Figure 6:
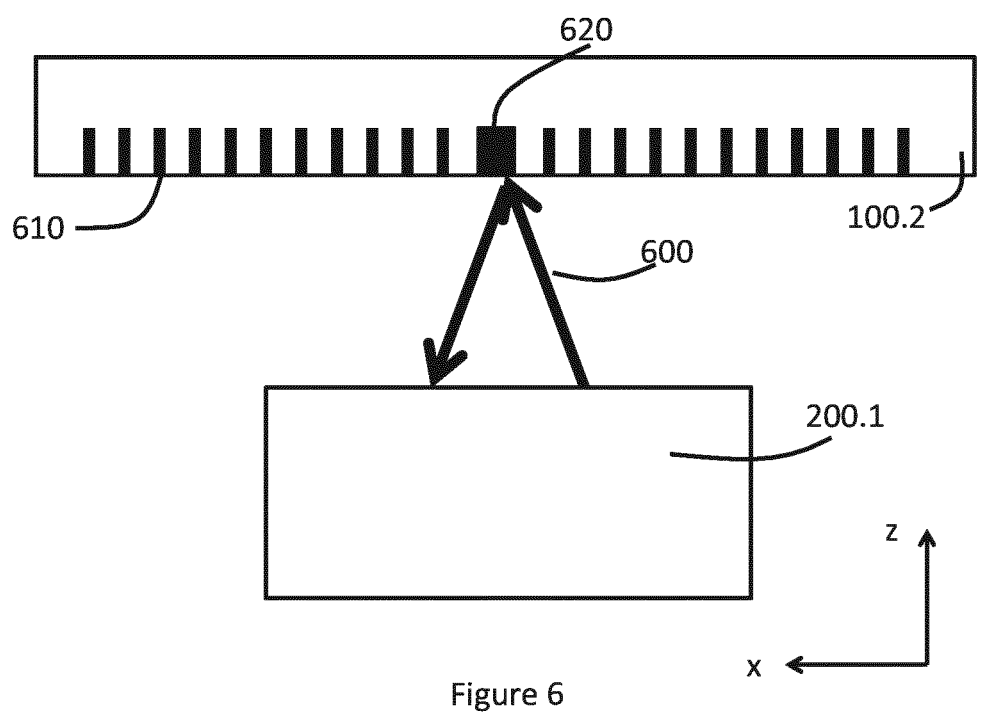
FIG. 6 depicts a positioning system with a further referencing system according to an embodiment of the present invention.

In addition or alternatively, a further referencing system may be provided. The further referencing system is shown in FIG. 6 in a schematic way. FIG. 6 shows one of the position sensors 200.1. The position sensor 200.1 projects a measurement beam 600 onto one of the gratings, for example grating 100.2. Under control of the measurement beam 600, the position sensor 100.2 is able to determine a position of the position sensor relative to the grating 100.2. The grating 100.2 is provided with a grating pattern 610 to interact with the measurement beam 600. For example, the grating pattern 610 is able to diffract the measurement beam 600. The grating pattern 610 is a repetitive grating, for example a pattern of lines, wherein each line has the same thickness as neighbouring lines and the same distance relative to neighbouring lines. For referencing of the first positioning measurement system, the grating 100.2 is provided with a referencing feature 620. The referencing feature 620 is a feature or a pattern of features that interacts with the measurement beam 600. For example, the referencing feature 620 has a line with a different width than the lines of the grating pattern 610. The width may be larger or smaller than the width of the lines of the grating pattern 610. The referencing feature 620 may have a line that is shorter or longer than the lines of the grating pattern 610. For example, the referencing feature 620 has a line that is closer to a line of the grating pattern 610 than the distance between two lines of the grating pattern 620. The referencing feature 620 may have a line that is reflective or transmissive. The referencing feature 620 may be provide on the grating pattern 610 or may be provided separately from the grating pattern 610. The referencing feature 620 may have a plurality of lines.

Figure 7:
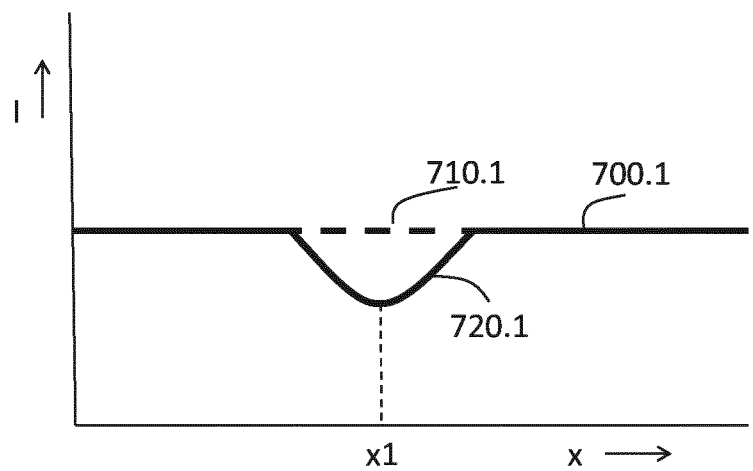
FIG. 7 depicts an intensity of a measurement beam received by a position sensor in an embodiment of the incremental position measurement system according to the invention.

When the position sensor 200.1 moves relative to the grating 100.2, the measurement beam 600 is projected onto the grating pattern 610. Since the grating pattern 610 is a repetitive grating, the intensity of the measurement beam 600 that is received by the position sensor 200.1 can be predicted. An example is given in FIG. 7. FIG. 7 shows the intensity 700.1 of the measurement beam 600 received by the position sensor 200.1. The intensity 700.1 is constant over a range of x-positions, except for around a position x1. At position x1, the intensity 700.1 is expected to be the value of 710.1. However, because of the referencing feature 620 at position x1, the intensity 700.1 changes to a lower value 720.1. In an embodiment, the intensity 700.1 changes to a higher value at position x1. Because of the change in intensity 700.1 at position x1, the first positioning system can determine the absolute position of the position sensor 200.1 relative to the grating 100.2. The intensity 700.1 may be different than a constant value over the range of x-positions. The lines of the intensity 700.1 may be sine-shaped or may have any other shape, as long as the change of intensity 720.1 can be determined.

The referencing feature 620 may be on one or more of gratings 100.1, 100.2 and 100.3. For example, the referencing feature 620 is outside an area where the position of the first object table and the second object table are determined by the first position measurement system with a high accuracy. The referencing feature 620 may be close to or at an area where a substrate is loaded onto the substrate table WT. Multiple referencing features 620 may be applied, for example one for each position sensor 200.1, 200.2, 300.1 and 300.2.

With respect to the second position measurement system as applied to measure the distance or relative position between the first and second object table, it is worth noting that various options exist. As a first example, capacitive sensors, preferably in a 6 DOF configuration can be applied. Such capacitive sensors may e.g. have a position accuracy in the range of 10 to 50 nm which is sufficient for referencing or zeroing an incremental position measurement system such as an encoder measurement system.

As a second example, optical sensors e.g. comprising interferometers such as Fizeau interferometers or coupled cavity interferometers can be mentioned.

As a third example, the use of absolute encoder based position measurement systems can be mentioned.

In the embodiment above, the sensors 450 are mounted on the object tables, and the gratings 100.1, 100.2 and 100.3 are mounted to a reference frame, e.g., the metrology frame MF. In an alternative embodiment, the sensors 450 are mounted to the metrology frame MF. The metrology frame MF may be substantially stationary, for example stationary to the projection system PS. In the alternative embodiment, the at least one of the gratings 100.1, 100.2, 100.3 is mounted on the object table. The grating may be mounted on the edge of a top surface of the object table. The grating may be mounted on a bottom side of the object table. The grating on the bottom side of the object table may have substantially the size of a substrate or may cover substantially the whole of the bottom side.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning system for positioning an object in a lithographic apparatus, the positioning system comprising:
   a first object table moveable in an operating area;
   a second object table moveable in the operating area;
   a first position measurement system configured to provide an incremental position measurement of the second object table relative to a reference when in the operating area, wherein the first position measurement system is configured to provide an absolute position measurement of the first object table relative to the reference;
   a second position measurement system configured to provide an absolute position measurement of the first object table relative to the second object table, and wherein the first position measurement system is further configured to provide an absolute position measurement of the second object table relative to the reference based on the absolute position measurement of the first object table relative to the reference and on the absolute position measurement of the first object table relative to the second object table.

2. The positioning system of claim 1, wherein the first position measurement system comprises a sensor array mounted to the reference, a first sensor target mounted to the first object table and a second sensor target mounted to the second object table for determining the absolute position measurement of the first object table and the incremental position measurement of second object table relative to the reference when in the operating area.

3. The positioning system of claim 1, wherein the first position measurement system comprises an encoder based measurement system.

4. The positioning system of claim 1, wherein the second position measurement system comprises a capacitive measurement system.

5. The positioning system of claim 1, wherein the second position measurement system is a 6 DOF measurement system.

6. The positioning system of claim 1, wherein the first position measurement system comprises a first sensor mounted to the first object table and a sensor target mounted to the reference providing the absolute position measurement of the first object table relative to the reference when in the operating area, wherein the first position measurement system comprises a second sensor mounted to the second object table for cooperating with the sensor target to provide the incremental position measurement of the second object table.

7. The positioning system of claim 1, further comprising a referencing system for providing the absolute position measurement of the first object table relative to the reference.

8. The positioning system of claim 7, wherein the first positioning system is provided with a reference feature to determine an absolute position of one of the first object table and the second object table relative to the reference.

9. A lithographic apparatus comprising:
   a support constructed to support a patterning device, the patterning device being capable of imparting a radiation beam with a pattern in its cross-section to form a patterned radiation beam;
   a projection system to project the patterned radiation beam onto a substrate;
   a substrate table to hold the substrate; and
   a positioning system according to claim 1.

10. The lithographic apparatus according to claim 9, wherein at least one of the first object table and the second object table comprises the substrate table, wherein the reference is connected to the projection system.

11. The lithographic apparatus according to claim 10, wherein the second position measurement system is configured to provide the absolute position measurement of the first object table relative to the second object table during a swap during which one of the first object table and second object underneath the projection system is swapped for the other of the first object table and second object table.

12. The lithographic apparatus according to claim 9, wherein at least one of the first object table and second object table comprises a measurement table.

13. A device manufacturing method comprising projecting a patterned beam of radiation onto a substrate, wherein projecting the patterned beam is preceded by positioning a substrate using a positioning system according to claim 1.

14. The positioning system of claim 1, wherein the first positioning measurement system is further configured to provide an incremental position measurement of the first object table relative to the reference.

15. A method of determining an absolute position of a second object table relative to a reference in a lithographic apparatus comprising a first object table and the second object table, the method comprising:
   obtaining an absolute position measurement of the first object table relative to the reference;
   obtaining an incremental position measurement of the second object table relative to the reference;
   obtaining an absolute position measurement of the first object table relative to the second object table;
   determining the absolute position of the second object table relative to the reference based on the absolute position measurement of the first object table relative to the reference and on the absolute position measurement of the first object table relative to the second object table.

* * * * *